United States Patent [19]

Baker

[11] Patent Number: 6,092,204
[45] Date of Patent: Jul. 18, 2000

[54] FILTERING FOR PUBLIC DATABASES WITH NAMING AMBIGUITIES

[75] Inventor: Brenda Sue Baker, Berkeley Heights, N.J.

[73] Assignee: AT&T Corp, New York, N.Y.

[21] Appl. No.: 09/327,453

[22] Filed: Jun. 8, 1999

Related U.S. Application Data

[63] Continuation of application No. 08/724,445, Oct. 1, 1996.
[51] Int. Cl.⁷ ..................................................... G06F 13/00
[52] U.S. Cl. .......................................... 713/201; 713/200
[58] Field of Search .................................... 713/200, 201, 713/202

[56] References Cited

U.S. PATENT DOCUMENTS

| | | | |
|---|---|---|---|
| 5,678,041 | 10/1997 | Baker et al. ................................. | 707/9 |
| 5,696,898 | 12/1997 | Baker et al. ............................. | 713/201 |
| 5,884,033 | 3/1999 | Duvall et al. ........................... | 709/206 |

*Primary Examiner*—Ly V. Hua

[57] ABSTRACT

Multiple approaches are used with a filter to handle naming ambiguities when requesting access to a plurality of network resources through a public network such as the Internet. One approach is to consider responses from the public network as well as requested URLs in determining whether to allow or deny resources. The response information used may include header information or the resource itself. If the header information includes a new URL, the new URL can be forwarded to the requester, or submitted to the public network. A permission database is queried to determine whether a resource corresponding to the new URL should be forwarded to the requestor. A checksum database can also be used to determine if a specific resource should be forwarded to the requestor. Another approach is to record and maintain a database of aliases for URLs. When a URL is requested, the alias URLs are determined for that URL. The alias URLs can then be queried in the permission database to determine if the resource corresponding to the aliases can be accessed by the requesting terminal before the URL is requested from the public network.

11 Claims, 1 Drawing Sheet

FILTERING FOR PUBLIC DATABASES WITH NAMING AMBIGUITIES

CROSS-REFERENCES TO RELATED APPLICATIONS

This application claims the benefit of U.S. application Ser. No. 08/724,445, filed Oct. 1, 1996 entitled "Improved Filtering For Public Databases With Naming Ambiguities," the entire disclosure of which is incorporated by reference herein.

TECHNICAL FIELD

The invention relates to controlling database access and, more particularly, to selectively providing such control with respect to otherwise public databases which include naming ambiguities for their resources.

BACKGROUND OF THE INVENTION

A number of systems and methods have been proposed or created to control access to remote resources publicly available to users of other computers through the collection of networks known as the Internet. The collection of all such publicly available resources, linked together using files written in Hypertext Mark-up Language ("HTML"), and including other types of files as well, is known as the World Wide Web ("WWW"). Some systems that have been proposed or created to control access to remote resources include a database of information about WWW resources and a program that allows or blocks access by a user to resources based on information stored in the database. A program that controls access to remote resources will be termed a filter. A filter may be embodied in software running on the client machine or on a separate machine.

In one embodiment, the database or permissions derived from the database are stored local to filter, either on the same machine or within a common firewall. Such a system is described in U.S. patent application Ser. No. 08/469,342, "System and Method for Database Access Control", filed on Jun. 6, 1995. In another embodiment, the filter sends messages to a remote server that serves messages containing information from the database, and the filter uses that information to determine whether to permit access to a particular resource. In either case, the filtering code may be part of a browser, part of a proxy server, or a separate program that determines whether to allow or deny resources. These scenarios are under discussion by groups formed by the WWW Consortium and the Internet Engineering Task Force. Resources are requested in the Hypertext Transport Protocol ("http") by means of a name such as a Uniform Resource Identifier ("URI") referring to a resource at the destination machine, or a Uniform Resource Locator ("URL") which contains both a URI and the domain name or IP address of the remote site which the URI is stored. A database of information about resources may refer to resources by means of such names and addresses or by expressions.

However, URLs are not unique identifiers for resources. Distinct URLs can name the same resource in the sense that clients requesting these URLs will receive identical resources in response, and repeated requests for a single URL may result in the client's receiving different resources at different times. The following situations describe some ways in which such naming ambiguities occur.

To start, it is necessary to describe how distinct resources can name the same resource. This can happen in several ways. First, it can happen because different domain names are mapped by a Domain Name Server to the same physical server. Second, it can happen because a server knows that different path names at its site are aliases for the same resource. Third, it can happen when identical copies of the resource are stored, or mirrored, at distinct sites with different URLs. Finally, it can happen indirectly as follows. When a protocol such as http is initiated, the information transmitted in the protocol can include protocol status information, resource information, and/or a resource, as well as other fields. Information about a resource can include specific data such as the content type or last modification date but also can include data such as a different URL for the resource. Status information can include a response code indicating that a request for a resource should be redirected to another URL. Thus, the following scenarios are possible. First, when the client requests the resource named by a URL, the remote server may return a redirection code and a new URL, and the client may then request the new URL separately. A second possibility is for the remote server to return a resource along with a new URL; in this case, there is no guarantee that the URL is a correct name for the resource, in the sense that a separate request for that URL is not guaranteed to produce a response with the identical resource. A third possibility is that when a client requests a URL from a remote server, the remote server sends a request for a different URL to another server and forwards the response back to the client. Redirections are commonly used because the resource moved, because it was requested by a method such as an image map where the requested URL includes keywords that encode information that the remote server uses to compute a URL to return, because it was requested via a Common Gateway Interface command which executes on the remote machine to determine what resource to return, or because the server uses redirections to facilitate collection of data on request behavior of individual users. The resource returned may also be computed on the fly from the information in the request.

Furthermore, requests for the same URL may result in distinct responses at different times, either because the resource itself has changed or because the remote server chooses to send back different resources or different redirection URLs at different times. When a request is made for a resource, the response may include a modification date, but in general the modification date is not guaranteed to be updated when changes are made to the file. For a file, the value of the file is often described by a checksum. A checksum or message digest is a number that is calculated from the resource such that identical resources are guaranteed to have the same checksum, and distinct resources are unlikely to have the same checksum. A number of such procedures exist in the literature. An example is the Message Digest 5 ("MD5") checksum procedure, which also has the feature that given a number, it is difficult to create a resource with that number as its checksum. This particular procedure is well known in the art, and discussed in *Applied Cryptography: protocols, algorithms, and source code in C*, by Bruce Schneier, Wiley Publishing, 1994, ISBN 0-471-59756-2. For practical purposes, it is ordinarily assumed that files are identical if and only if the checksums are identical.

In the above situations, the server of the resources may have knowledge of the relationships between URLs, but the client and user of the client do not have a prior knowledge of the relationships. For a given request, the client may see multiple URLs through redirections, but will not generally see all possible URLs for the same resource. The client may or may not show the user the new URL and the user of a client may not be aware of the existence of multiple URLs for the same resource. Thus, a filter that functions as a rater by rating resources using software for storing ratings in a database based on URLs may cause a rating to be stored for one or several or these URLs but not for all URLs naming the same resource, and the filter may not know of the existence of these other URLs.

A proposal has been made to assign a unique permanent name called a Uniform Resource Name, or URN, to each resource. In this case, servers would translate a URN into a URL that would specify a specific copy of this resource. Distinct requests could result in the same URN being translated into distinct URLs, depending, for example, on the physical location of the client. However, this approach would not eliminate all the sources of ambiguities described above.

The above naming problems can also occur in other situations, such as systems using databases of keywords, annotations for resources, quality ratings, or categorizations of resources.

SUMMARY OF THE INVENTION

The present invention utilizes multiple approaches to handling naming ambiguities in a filter. One approach is to consider responses from remote servers as well as requested URLs in determining whether to allow or deny resources. The response information used may include header information or the resource itself. If the header information includes a new URL, the new URL can be forwarded to the requester, or submitted to the public network. A permission database is queried to determine whether a resource corresponding to the new URL should be forwarded to the requestor. A checksum database can also be used to determine if a specific resource should be forwarded to the requester.

Another approach is to record and maintain a database of aliases for URLs. When a URL is requested, the alias URLs are determined for that URL. The alias URLs can then be queried in the permission database to determine if the resource corresponding to the aliases can be accessed by the requesting terminal before the URL is requested from the public network.

DETAILED DESCRIPTION OF THE INVENTION

Figure 1:
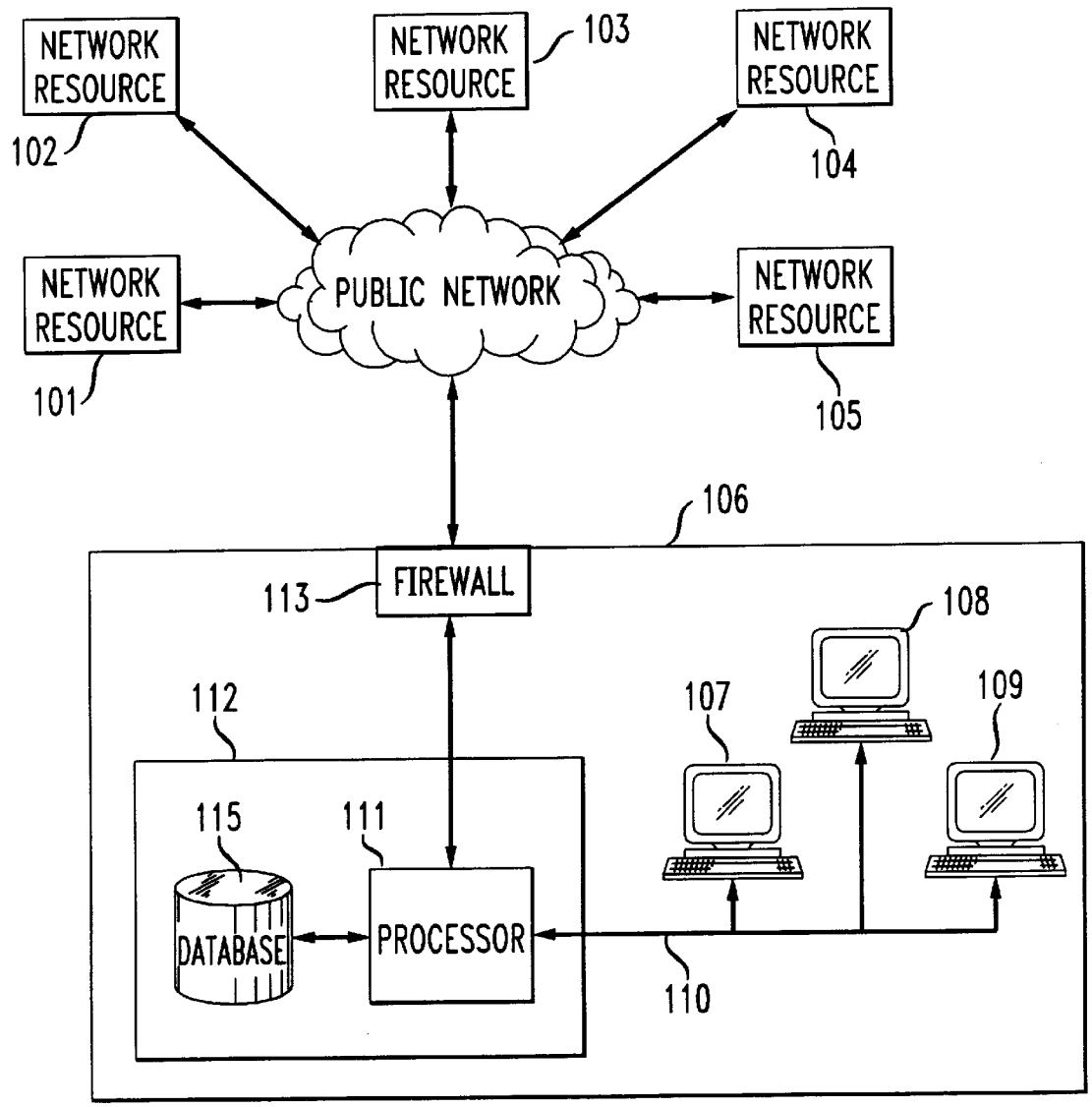
FIG. 1 is a simplified diagram of an embodiment of a system that can utilize the present invention.

FIG. 1 is a simplified diagram of an embodiment of a system that can utilize the present invention. As shown in FIG. 1, the system includes a public network 100, network resources 101–105, and a user site 106. Particular users at the user site 106 gain access to the public network 100 via user terminals 107, 108 and 109. Each of the user terminals 107–109 is linked by a local area network ("LAN") 110 to a processor 111 within a proxy server 112. Proxy server 112 provides a connection from the processor 111 to the public network 100 via a firewall 113. In the embodiment shown in FIG. 1, the processor 111 runs filtering code which controls access to the network resources 101–105 by the user terminals 107–109. However, each user terminal 107–109 can also include a processor that runs filtering code for individually controlling access for each terminal.

Requests from user terminals 107–109 for access to the network resources 101–105 through the public network 100 are submitted to the processor 111 within proxy server 112. In this particular embodiment of the invention, the submitted requests are assumed to be in the form of URLs. As is well known in art, when URLs are submitted to a proxy server, the particular requesting user terminal is identified to the proxy server by an identification header attached to the request.

The processor 111 is coupled to a database 115. The database 115 stores information about the network resources 101–105, in the form of URLs, and the user terminals 107–109 in the form of terminal IDs. The processor 111 can query the database 115 before allowing a terminal to receive a particular URL. For example, the database 115 may store a list of URLs that each user terminal 107–109 has permission to access. In this example, the processor 111 will not allow a user terminal 107–109 to receive a URL that it does not have permission to receive. As another example, the database 115 may store a list of ratings corresponding to the URLs, and a list of categories of ratings that each user terminal 107–109 is allowed receive. In this example, the processor 111 will not allow a user terminal 107–109 to receive a URL that has a rating that is not included in that terminal's category of permissible ratings.

Multiple approaches can be used with the system of FIG. 1 in order to handle naming ambiguities of URLs. One approach is to submit every URL request to the public network, and determine whether to forward the response from the public network to the requesting user terminal based on the response from the public network. For example, referring to the system of FIG. 1, when a requesting user terminal transmits a URL via LAN 110, the processor 111 forwards the request for resources to the public network 100 via the firewall 113. The processor 111 receives a response from the public network request and decides whether to allow or deny the resource to the requesting user terminal based on the response. This decision may be based on the response header or on the response resource, and may utilize the database 115.

If the response is a redirection, which includes a redirection code and a new URL, different options are available. Specifically, in one option the processor 111 will forward the redirection to the requesting user terminal 106, since there is generally no content in the message except the header. The user terminal can be expected to request the new URL. The processor 111 forwards the new URL request to the public network 100. If the response is a resource corresponding to the new URL, the processor 111 queries the database 115 to determine whether the user terminal should get access to the resource. If the response is another redirection, the processor again forwards the new URL to the requesting user terminal.

Alternatively, upon receiving a redirection response, the processor 111 will act as if the user terminal has requested the new URL. Therefore, the processor 111 will either query the database 111 based on the new URL and the requesting user terminal to determine whether to forward the new URL request to the public network 100, or the processor 111 will forward the request for the new URL to the public network 100 and if necessary, make subsequent redirection requests as well, and query the database 115 for any or all of these URLs to determine whether to provide the final resource to the user terminal.

On the other hand, if the response is a resource with a field specifying a new URL, the processor 111 can look up the new URL in the database 115 to determine whether to allow the resource or forbid it to the requesting terminal.

Another option for using response information is for the database 115 to store, corresponding to each URL, a checksum computed from the resource corresponding to the URL. When a user terminal requests a URL, the processor 111 requests the resource, computes a checksum on the resource, and looks the checksum up in the database 115 to determine whether a resource with that checksum is approved for the requesting terminal. This method could be used in addition to or in place of looking up URLs in the database 115.

A second approach to handling naming ambiguities of URLs is to store in database 115 a list of aliases discovered by the processor 111, or any other filters or browsers that request resources on the WWW. When the processor 111 receives a request for a URL, it accesses the alias database 115 to determine which URLs are considered to be aliases for the requested URL. The alias URLs are then looked up in the database 115 to determine whether the requesting terminal can have access to that resource.

The above shall not be construed to be limited to URLs; other naming schemes such as URNs could be substituted or added as additional aliases.

The above schemes can be used separately or in combination. They can also be used in other situations in which naming problems arise, such as in systems using databases of keywords in resources, annotations of resources, quality ratings, or categorizations of resources.

What is claimed is:

1. A filtering device, comprising:

a processor;

a database operably coupled to said processor;

a query module operably coupled to said database and said processor to query said database using a first resource identifier, a first resource corresponding to said resource identifier, and a user identification code; and a decision module operably coupled to said query module to determine whether to send said first resource to a user corresponding to said user identification code in accordance with said query.

2. The filtering device of claim 1, wherein said database contains a first list of resource identifiers and a second list of resource checksums, and said query module compares said first resource identifier and said first resource to said first and second lists, respectively, and said decision module operates in accordance with said comparison.

3. The filtering device of claim 1, wherein said first resource identifier is a uniform resource locator.

4. The filtering device of claim 1, wherein said first resource is a Hyper-Text Markup Language file.

5. The filtering device of claim 1, wherein said first resource contains a second resource identifier, and further comprising a redirect module operably coupled to said decision module to request a second resource using said second resource identifier.

6. The filtering device of claim 5, wherein said query module queries said database using said second resource identifier and said second resource; and said decision module determines whether to send said second resource to said user in accordance with said query.

7. A machine-readable medium whose contents cause a computer system to selectively restrict access to a plurality of network resources accessible through a network, by performing the steps of:

a) receiving a request for at least one of said plurality of network resources from a user, said request including a first resource identifier and a user identification code;

b) determining whether to submit said first resource identifier to said network by querying a database using said first resource identifier and said user identification code;

c) submitting said first resource identifier to said network;

d) receiving a first response from said network, said first response including a first response resource; and e) determining whether to forward said first response resource to said user by querying said database using said first response resource and said user identification code.

8. The machine-readable medium of claim 7, wherein said step of determining using said response resource comprises the steps of:

searching said first response resource for a list of key terms; and querying said database to determine whether to forward said first response resource to said user, said query based on said search and said user identification code.

9. The machine-readable medium of claim 7, wherein said step of determining using said response resource comprises the steps of:

computing a checksum of said first response resource; and querying said database to determine whether to forward said first response resource to said user, said query based on said checksum and said user identification code.

10. The machine-readable medium of claim 7, wherein said response includes a second resource identifier, further comprising the steps of:

a) determining whether to submit said second resource identifier to said network by querying a database using said second resource identifier and said user identification code;

b) submitting said second resource identifier to said network;

c) receiving a second response from said network, said second response including a second response resource; and d) determining whether to forward said second response resource to said user by querying said database using said second response resource and said user identification code.

11. The machine-readable medium of claim 10, wherein said steps of querying using said first and second resource identifiers comprises the steps of:

obtaining an alias of said first and second resource identifiers; and querying said database to determine whether to submit said first and second resource identifiers to said public network, said query based on said alias and said user identification code.

* * * * *